United States Patent
Cox et al.

[11] Patent Number: 6,023,782
[45] Date of Patent: Feb. 8, 2000

[54] RAM BASED KEY EQUATION SOLVER APPARATUS

[75] Inventors: Charles Edwin Cox, San Jose; Martin Aureliano Hassner, Palo Alto, both of Calif.

[73] Assignee: International Business Machines Corporation, Armonk, N.Y.

[21] Appl. No.: 08/766,681

[22] Filed: Dec. 13, 1996

[51] Int. Cl.[7] .................................................. H03M 13/00
[52] U.S. Cl. ............................................................ 714/784
[58] Field of Search .............................. 371/37.11, 37.12, 371/37.7, 37.5; 364/746.1; 714/784, 781

[56] References Cited

U.S. PATENT DOCUMENTS

| | | | |
|---|---|---|---|
| 4,162,480 | 7/1979 | Berlekamp | 371/37.11 |
| 4,498,175 | 2/1985 | Nagumo et al. | 371/37.5 |
| 4,642,808 | 2/1987 | Baggen | 371/37.11 |
| 4,675,869 | 6/1987 | Driessen | 371/37.8 |
| 4,763,332 | 8/1988 | Glover | 371/37.5 |
| 4,916,702 | 4/1990 | Berlekamp | 371/39.1 |
| 5,297,153 | 3/1994 | Baggen et al. | 371/37.08 |
| 5,313,464 | 5/1994 | Reiff | 271/37.11 |
| 5,323,402 | 6/1994 | Vaccaro et al. | 371/37.08 |
| 5,383,204 | 1/1995 | Gibbs et al. | 371/37.7 |
| 5,504,758 | 4/1996 | Inoue et al. | 371/42 |
| 5,642,367 | 6/1997 | Kao | 371/37.11 |

*Primary Examiner*—Hoa T. Nguyen
*Assistant Examiner*—Shelly A. Chase
*Attorney, Agent, or Firm*—James C. Pintner; Morgan & Finnegan LLP

[57] ABSTRACT

The present invention is a circuit for performing a computation of a plurality of coefficients of an error locator polynomial and a plurality of coefficients of an error evaluator polynomial in a system for correcting errors in a Reed-Solomon encoded datastream, comprising a syndrome generator outputting syndromes of the datastream. The circuit of the present invention is coupled to the syndrome generator and receives the syndromes. The present invention comprises an arithmetic unit iteratively generating intermediate and final values of the plurality of coefficients of an error locator polynomial and the plurality of coefficients of an error evaluator polynomial; a random access memory, storing the intermediate and final values of the plurality of coefficients of an error locator polynomial and the plurality of coefficients of an error evaluator polynomial; and a control unit, controlling the arithmetic unit and the memory and detecting when the computation of the plurality of coefficients of an error locator polynomial and the plurality of coefficients of an error evaluator polynomial has been completed.

4 Claims, 14 Drawing Sheets

RAM BASED KEY EQUATION SOLVER APPARATUS

FIELD OF THE INVENTION

The invention relates to apparatus for solving the key equation in order to decode Reed-Solomon encoded data containing errors.

BACKGROUND OF THE INVENTION

Reed-Solomon codes are used to provide error correction for blocks of data. For example, they are widely used in communications and data storage applications. Much of the computational effort needed to decode a Reed-Solomon codeword received with errors is spent in solving the so-called key equation. There are several well-known methods for solving the key equation. Among these is a method proposed by Berlekamp. The Berlekamp method is often implemented in hardware in order to meet speed requirements of the application. Previous implementations of the method used individual registers to hold intermediate values required by the method.

SUMMARY OF THE INVENTION

The present invention is a circuit for generating a plurality of coefficients of an error locator polynomial and a plurality of coefficients of an error evaluator polynomial in a system for correcting errors in a Reed-Solomon encoded datastream. The system comprises a syndrome generator outputting syndromes of the datastream. The present invention is coupled to the syndrome generator and receives the syndromes. The present invention comprises an arithmetic unit iteratively generating intermediate and final values of the plurality of coefficients of an error locator polynomial and the plurality of coefficients of an error evaluator polynomial; a random access memory, storing the intermediate and final values of the plurality of coefficients of an error locator polynomial and the plurality of coefficients of an error evaluator polynomial; and a control unit, controlling the arithmetic unit and the memory and detecting when the computation of the plurality of coefficients of an error locator polynomial and the plurality of coefficients of an error evaluator polynomial has been completed.

BRIEF DESCRIPTION OF THE DRAWINGS

FIG. 2b is a block diagram of a controller 228 of FIG. 2a.

DETAILED DESCRIPTION OF THE INVENTION

Figure 1:
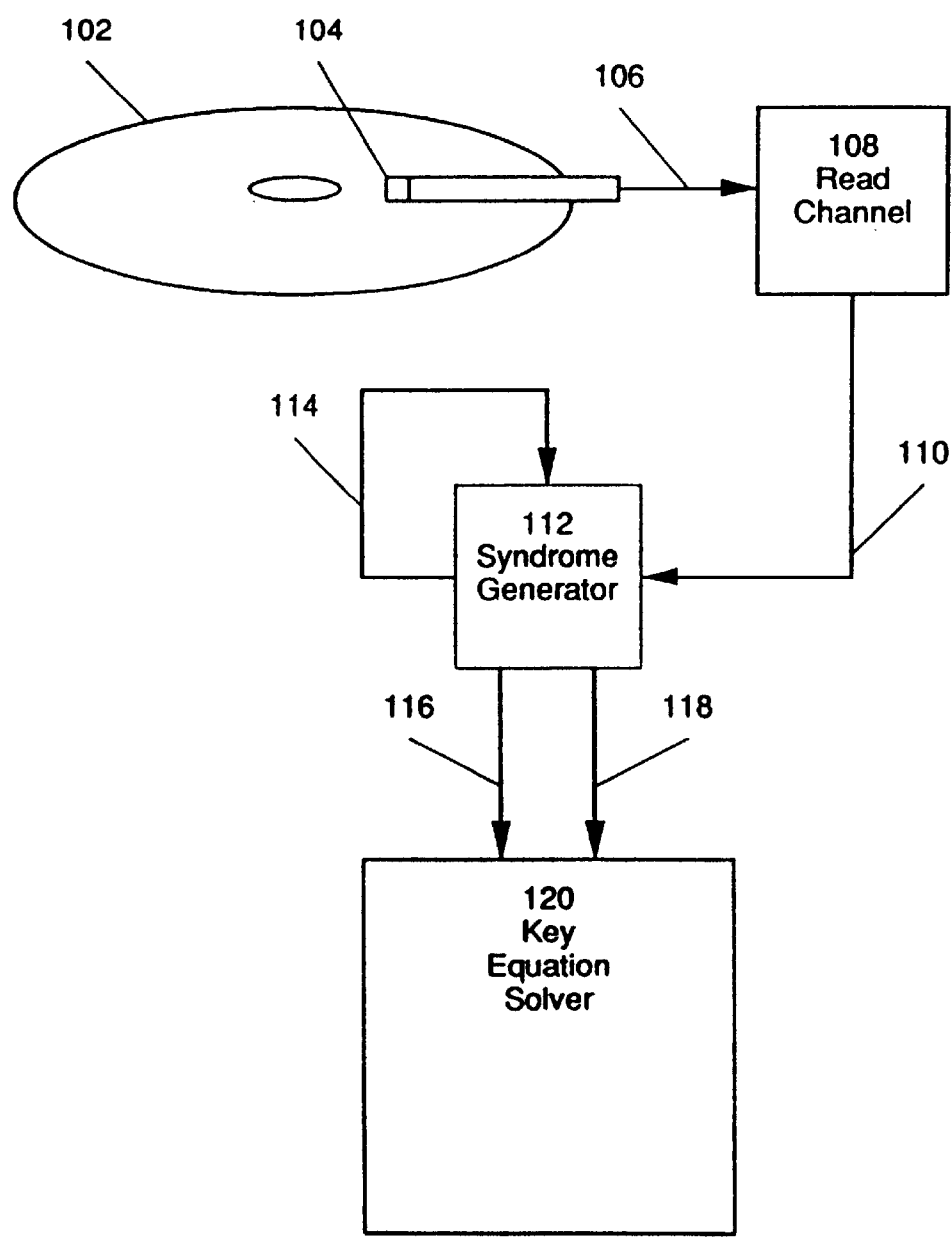
FIG. 1 is a block diagram of a hard disk drive incorporating the present invention.

In FIG. 1, major subsystems of a hard disk drive incorporating the present invention are shown. The signal recorded on disk 102 is read by read head 104. The analog signal 106 from read head 104 is input to read channel 108, which extracts a digital data stream 110. Digital data stream 110 is input to syndrome generator 112. Syndrome generator 112 computes syndromes for digital data stream 110. If the syndromes are all zero, an error free signal 114 is set and syndrome generator 112 is prepared for the next sector. If some of the syndromes are non-zero, this means that the sector contained errors and the key equation solver is to be activated. When such an error occurs, error signal 116 is set. This activates key equation solver 120, which takes the syndromes 118 as inputs. Key equation solver 120 then generates signals representing an error locator polynomial and an error evaluator polynomial, which are then used by other circuitry (not shown), such as, for example, the well-known Chien search circuit, to correct the errors in data stream 110.

The Berlekamp method, in a form compatible with the present invention, is shown in detail in the pseudocode listing of Table A.

TABLE A

```
v ← [0, 0, . . ., 0, 1]
p ← [0, 0, . . ., 0, 1]
u ← [0, 0, . . ., 0, 1]
q ← [0, 0, . . ., 0, 1]
d = 0
for k = 0 to 2 · T - 1
```

$$e \leftarrow \sum_{I=0}^{T} {}^{\bullet}S_{(k-I) \bmod (2 \cdot T)} \cdot v_I$$

```
    if (e = 0)
        for I = T downto I
            u_I ← u_{I-1}
            p_I ← p_{I-1}
        u_0 ← 0
        p_0 ← 0
    else if (2 · d³ k + 1)
        for I = T downto 1
            u_I ← u_{I-1}
            v_I ← v_I - (e · u_I)
```

TABLE A-continued $$p_I \leftarrow p_{I-1}$$
$$q_I \leftarrow q_I - (e \cdot p_I)$$
$$u_0 \leftarrow 0$$
$$p_0 \leftarrow 0$$
else
$$d \leftarrow k + 1 - d$$
$$g \leftarrow 1/e$$
for I = T downto 1
$$u_I \leftarrow g \cdot v_I$$
$$v_I \leftarrow v_I - (e \cdot u_{I-1})$$
$$p_I \leftarrow g \cdot q_I$$
$$q_I \leftarrow q_I - (e \cdot p_{I-1})$$
$$u_0 \leftarrow g \cdot v_0$$
$$p_0 \leftarrow g \cdot q_0$$

In the method described in Table A, the additions and subtractions are performed modulo two and the multiplications are performed under a Galois field. In a preferred embodiment, the Galois field has 256 elements. The method defines four vectors, u, v, p, and q, each of length T+1, where T is the correction power of the code. The u and p vectors are intermediate variables that are discarded at the completion of the process. At the completion of the process, the v, vector holds the coefficients of the error locator polynomial and the q vector holds the coefficients of the error evaluator polynomial. The process also uses the variable d, which is used to control branch decisions, the variable k, which counts iterations through the main loop, and the variable e, the error term.

The preferred embodiment of the present invention has been optimized for minimum hardware, at the expense of increased execution time. In the prior art, the elements of the four vectors used by the Berlekamp method are stored in dedicated hardware registers. A considerable savings in hardware and cost is realized in the present invention by eliminating the individual registers and storing all the intermediate variables in a random access memory (RAM) or register file. The saving is achieved through the elimination of both the registers and the multiplexors to route the register contents to the arithmetic units. Placing all intermediate variables in a RAM creates an execution bottleneck at the RAM. Speed could be recovered by using a multi-port RAM, but a single-port RAM is preferred due to cost considerations.

Figure 2A:
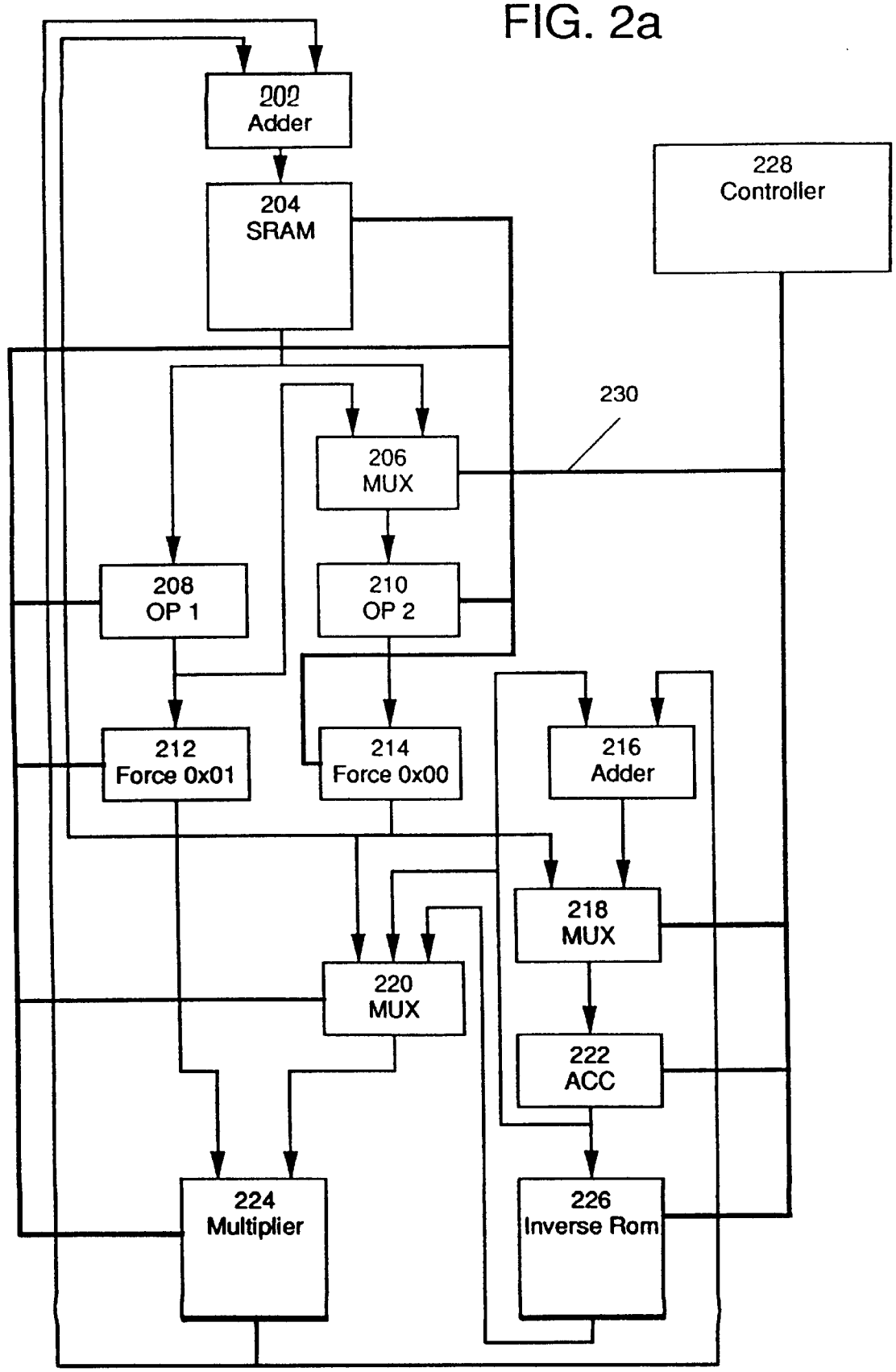
FIG. 2a is a block diagram of one embodiment of the present invention.

FIG. 2a is a block diagram of the preferred embodiment, which uses one RAM 204 and other well-known subsystems. Controller 228 controls the operation and timing of all other circuit elements. Control inputs of the various circuit elements are connected to outputs of controller 228. Status outputs of vanous circuit elements are connected to inputs of controller 228. All input and output connections are shown as control signals 230 in FIG. 2. The control signals used are described in detail below. RAM 204 is a RAM with a single, bi-directional port which an input mode and an output mode, controlled by control inputs. When in output mode, RAM 204 is coupled to the inputs of multiplexer (MUX) 206 and to Operand Register 1 (OP 1) 208. MUX 206 selects between the output of RAM 204 and the output of OPI 208 to determine the input to Operand Register 2 (OP2) 210. OP 1 208 and OP2 210 are eight-bit registers with selectable load functions controlled by controller 228. The outputs of OPI 208 and OP2 210 are coupled to forcing circuits 212 and 214, respectively. Forcing circuit 214 either passes the input to the output or drives the output to all zeros(0×00), depending on the state selected by controller 228. Forcing circuit 214 is designated force 0×00 in FIG. 2a to represent its all zeros forcing function. Forcing circuit 214 includes eight two input AND gates. Forcing circuit 212 either passes the input to the output or drives the output to binary one (0×01), depending on the state selected by controller 228. Forcing circuit 212 includes seven two input AND gates, one two input OR gate, and an inverter.

The output of forcing circuit 212 is coupled to multiplier 224. Multiplier 224 is a Galois field multiplier which generates the product of two operands under the Galois field. Forcing circuit 212 supplies one operand. The other operand is supplied by MUX 220, which selects among the output of forcing circuit 214, the output of accumulator (ACC) 222 and the output of inverse read-only memory (ROM) 226, as controlled by controller 228. The output of multiplier 224 is coupled to adder 202, as is the output of forcing circuit 214. Adder 202 and adder 216 are modulo two adders, that is, each is eight independent XOR gates. Multiplier 224 supplies one operand for adder 202, forcing circuit 214 supplies the other operand. The output of adder 202 is coupled to RAM 204 and data is input into RAM 204 when controller 228 selects the input mode of RAM 204.

Inverse ROM 226 outputs the inverse, under the Galois field, of its input. The size of ROM 226 depends on the number of elements in the Galois field being used. In a preferred embodiment, a 256 element Galois field is used and the size of ROM 226 is 256 bytes. Since the inverse of zero is undefined, location zero of the inverse ROM is not used in normal operation, but is loaded with 0×01 and used as element zero of the p vector during the first iteration of the main loop. Inverse ROM 226 accepts its input from ACC 222, which stores the data input to it. The input of ACC 222 is selected by MUX 218 from between the output of forcing circuit 214 and adder 216, as controlled by controller 228. Adder 216 accepts as operands the output of inverse ROM 226 and the output of ACC 222.

The size of the RAM depends on the maximum correction power that the key equation solver must support. The size of the RAM is equal to 4·I·T+2·T+1 bytes, where T is the maximum correction power of the code and I is the degree of the interleave. In a preferred embodiment, the key equation solver is capable of handling interleaved Reed-Solomon codewords, thus, I indicates the interleave of the codewords. The size of the rest of the hardware excluding the few gates used to generate the address into the RAM is independent of the correction power of the code. Table B gives the RAM size for various correction powers, with a three-way interleave assumed.

TABLE B

| Correction Power | RAM Size (in bytes) |
| --- | --- |
| 1 | 15 |
| 2 | 29 |
| 3 | 43 |
| 4 | 57 |
| 5 | 71 |
| 6 | 85 |

Figure 2B:
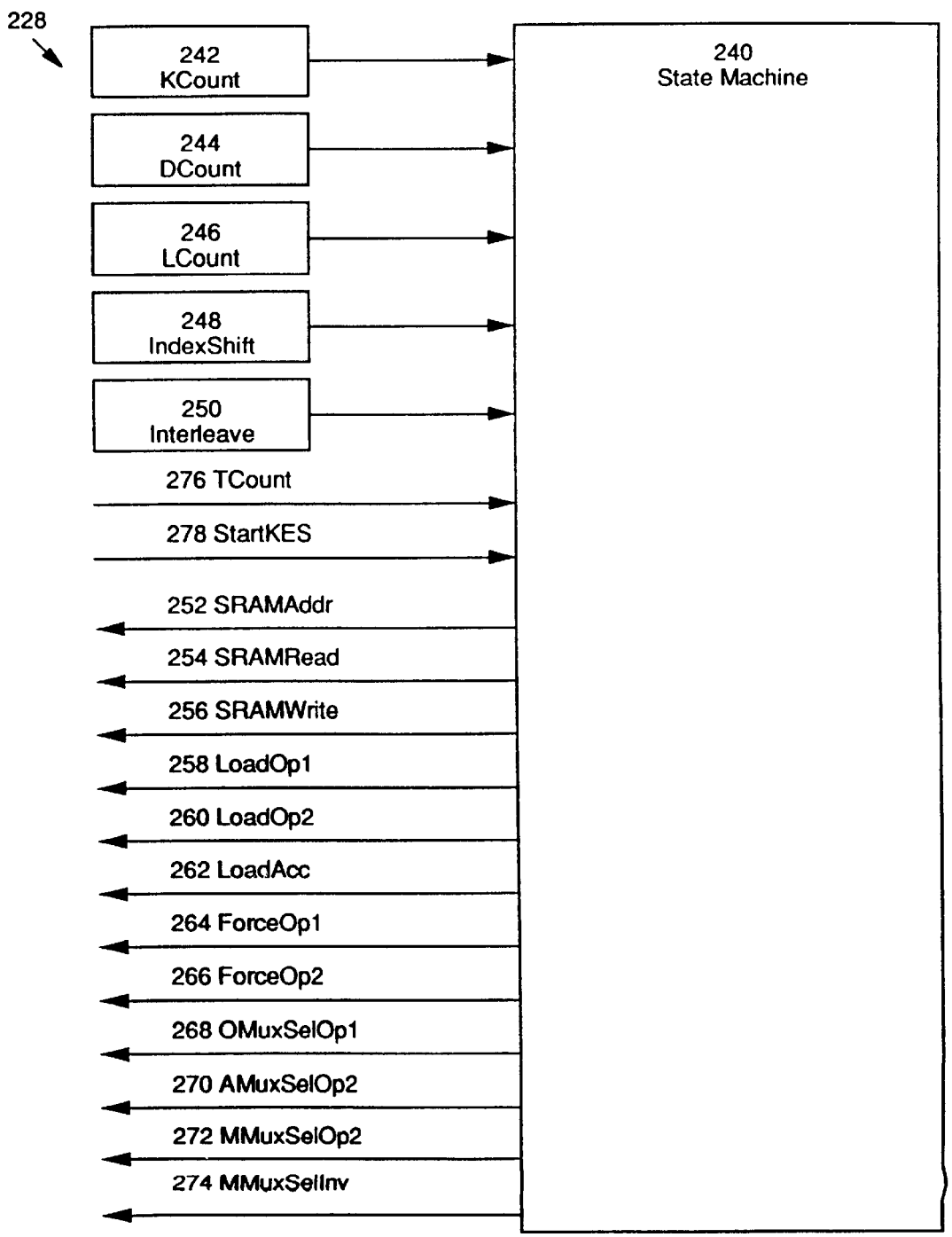
Figure 3A:
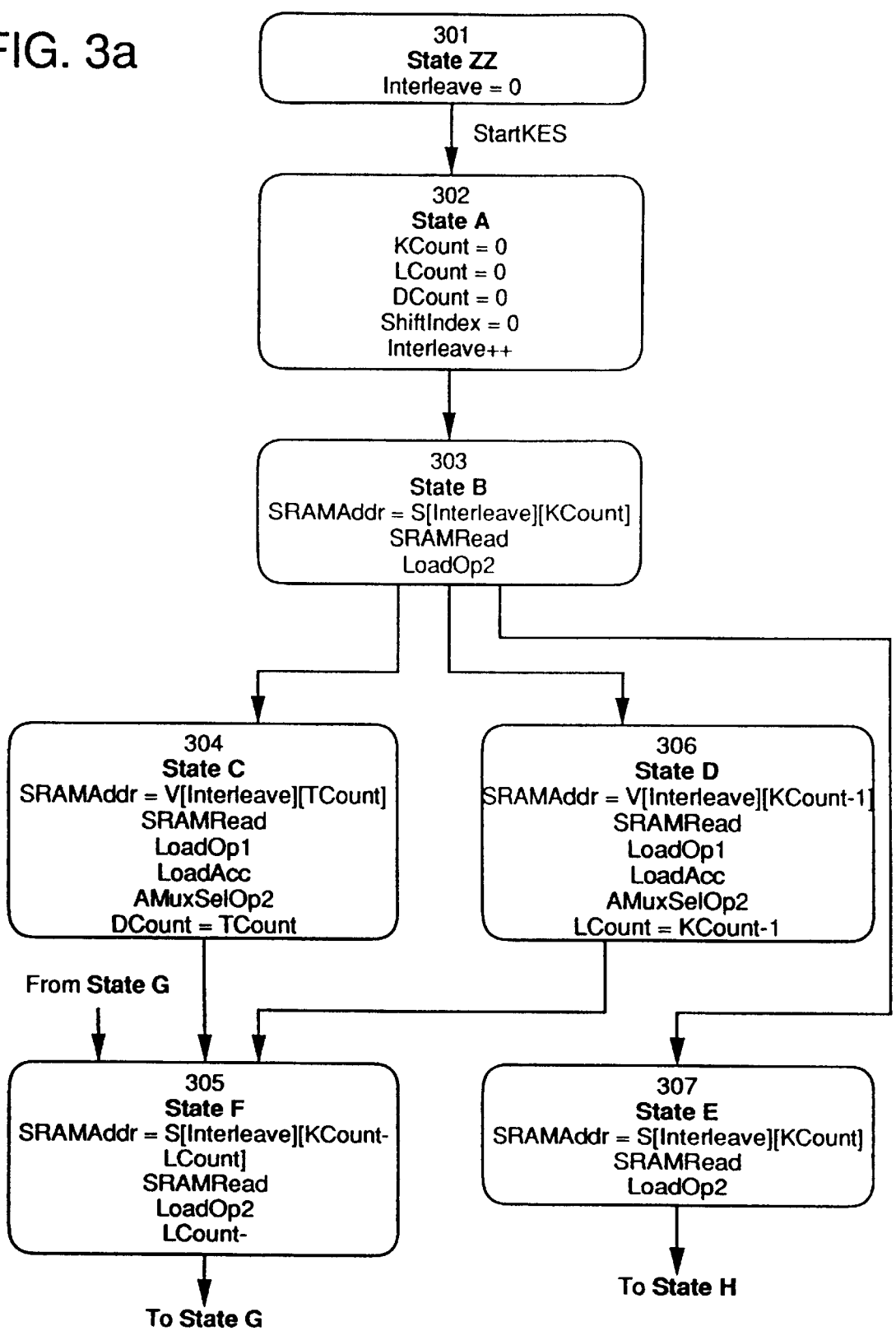
FIG. 3a is a flow diagram of a state ZZ 301 through a state E 307 of a process 300 which is performed by the present invention.
Figure 3B:
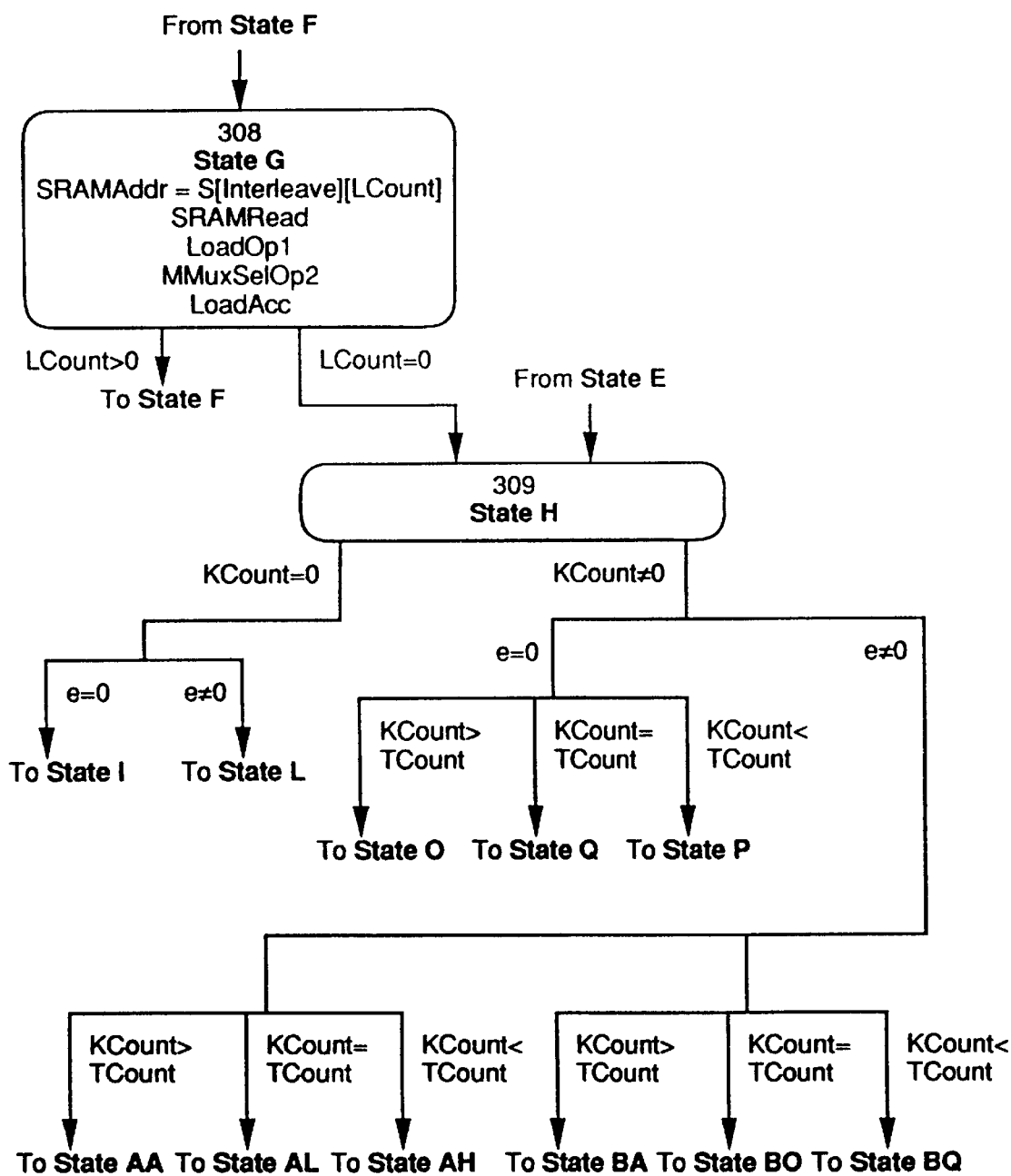
FIG. 3b is a flow diagram of a state G 308 through a state H 309 of a process 300 which is performed by the present invention.
Figure 3C:
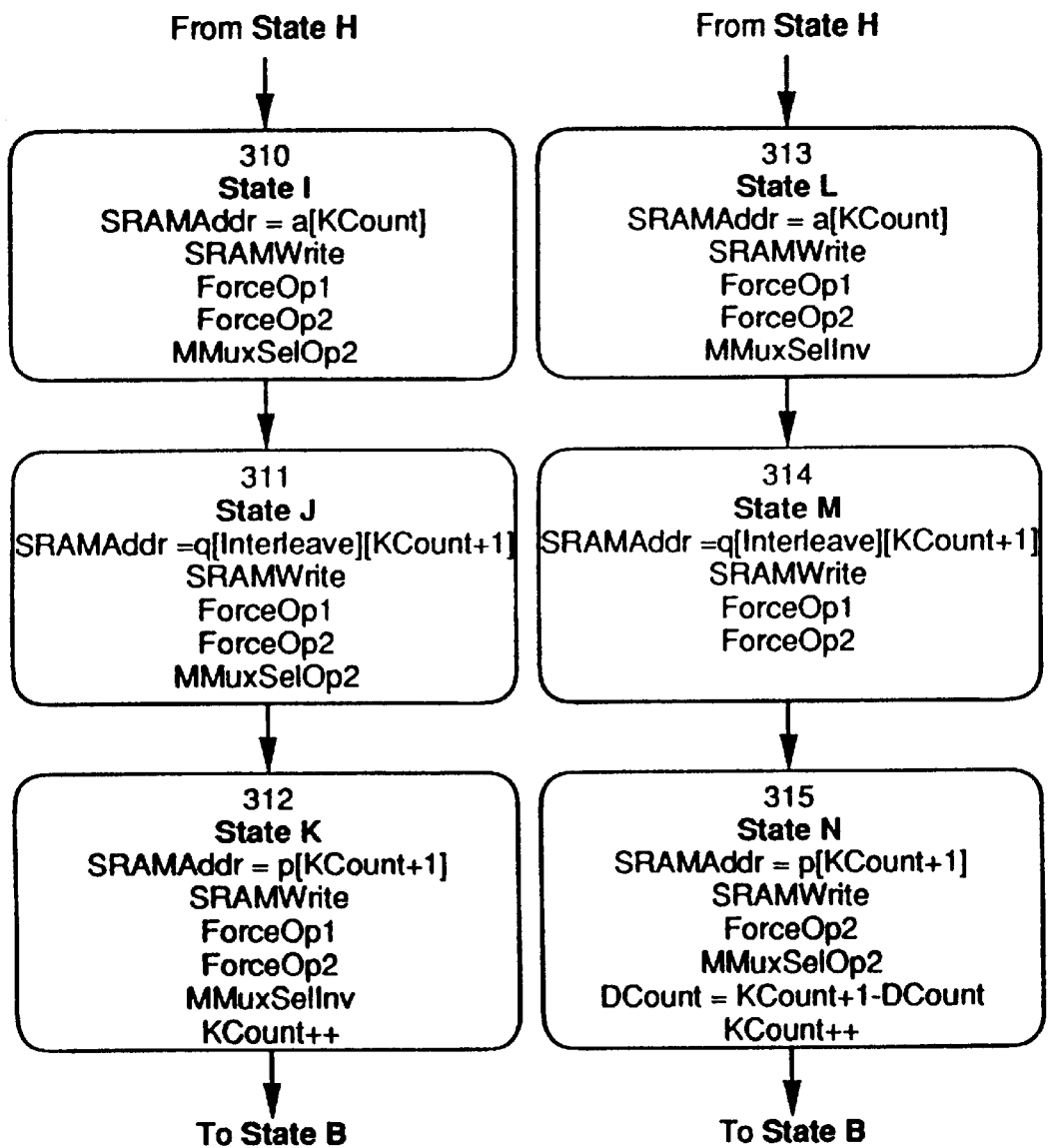
FIG. 3c is a flow diagram of a state I 310 through a state N 315 of a process 300 which is performed by the present invention.
Figure 3D:
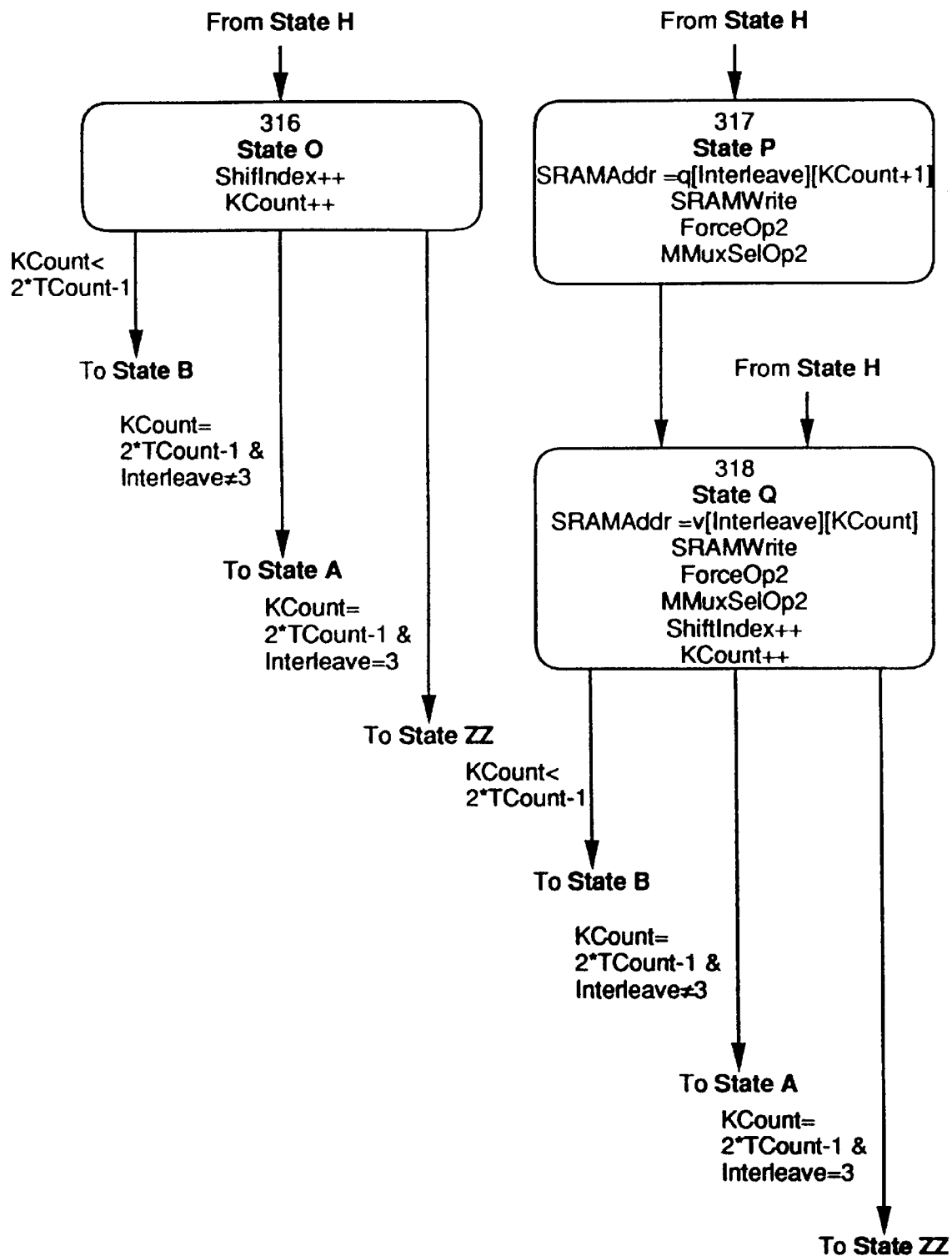
FIG. 3d is a flow diagram of a state O 316 through a state Q 318 of a process 300 which is performed by the present invention.
Figure 3E:
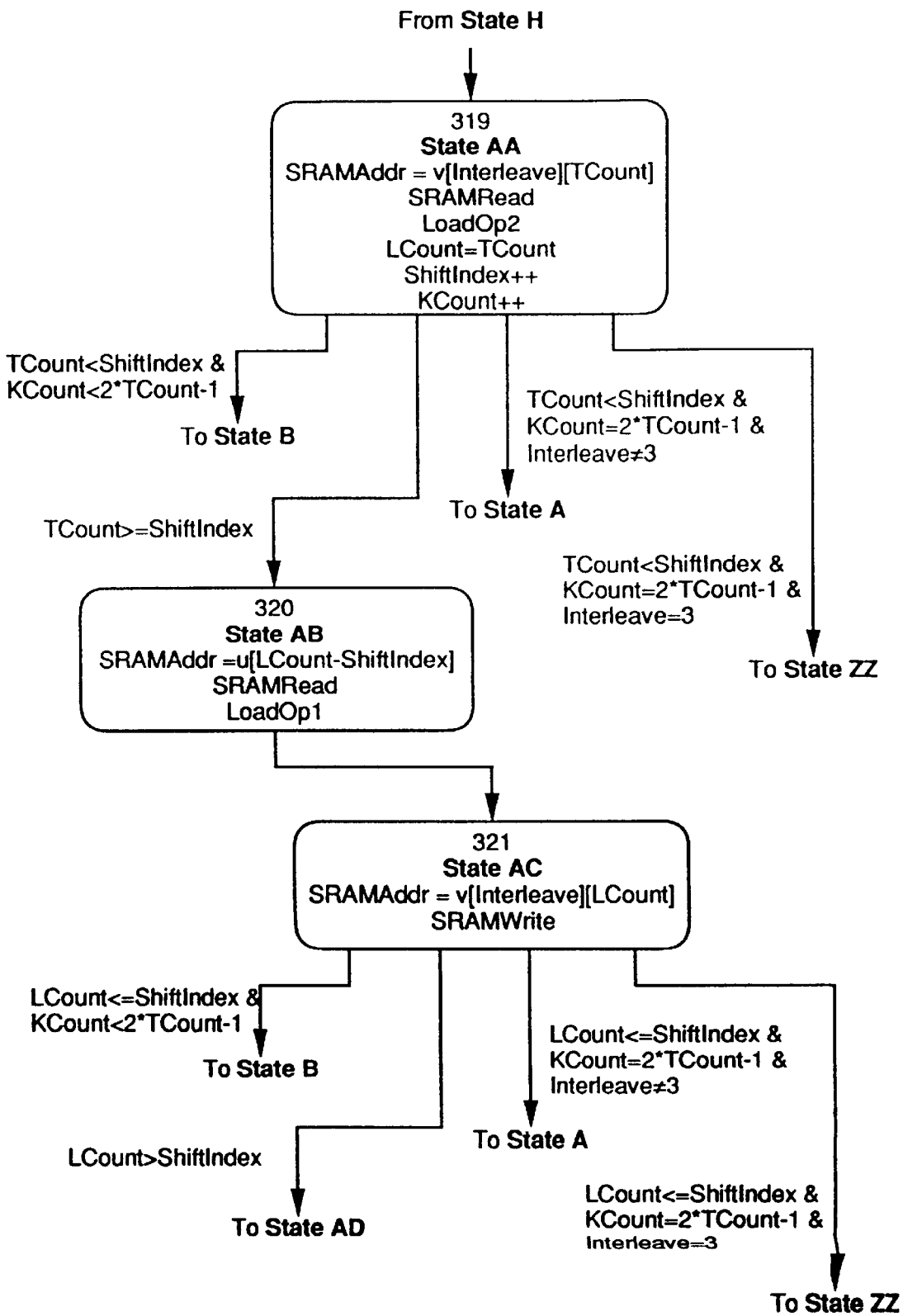
FIG. 3e is a flow diagram of a state AA 319 through a state AC 321 of a process 300 which is performed by the present invention.
Figure 3F:
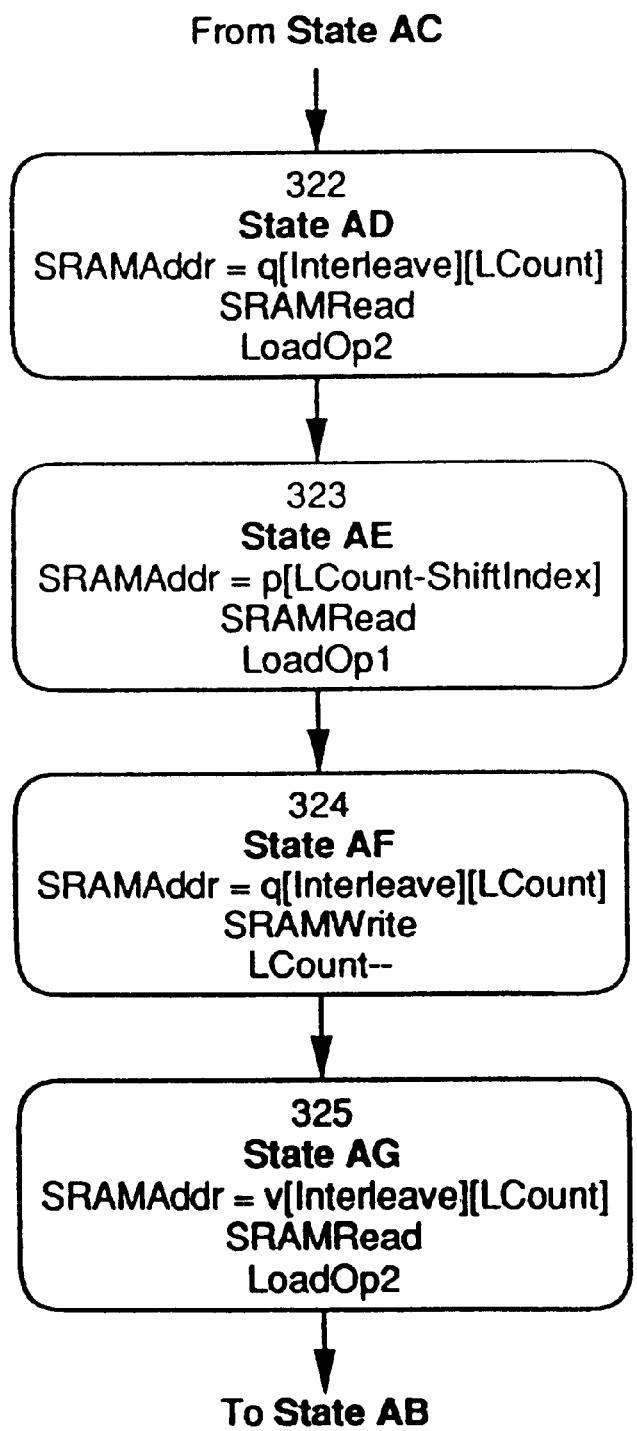
FIG. 3f is a flow diagram of a state AD 322 through a state AG 325 of a process 300 which is preformed by the present invention.
Figure 3G:
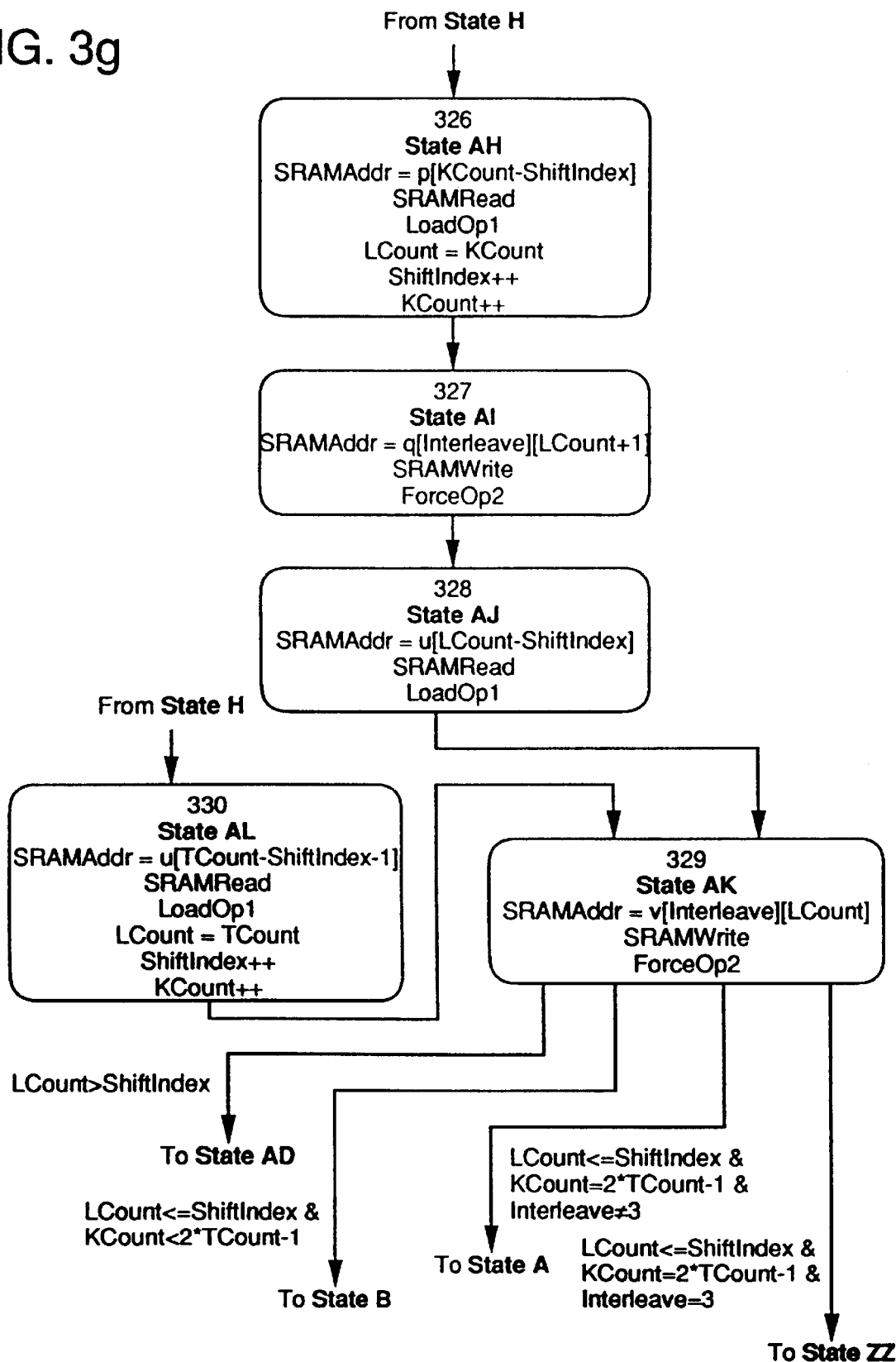
FIG. 3g is a flow diagram of a state AH 326 through a state AK 329 of a process 300 which is performed by the present invention.
Figure 3H:
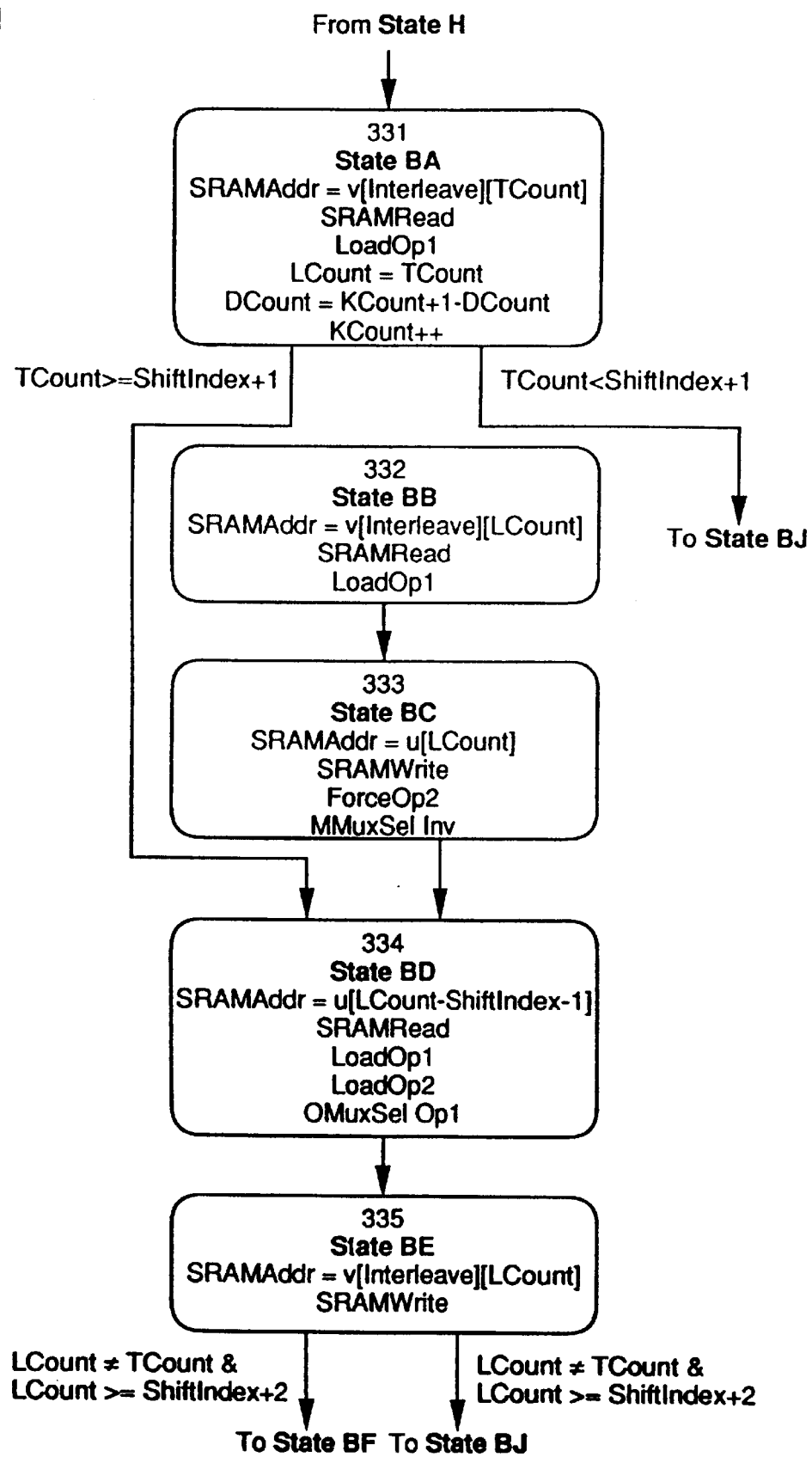
FIG. 3h is a flow diagram of a state BA 331 through a state BE 335 of a process 300 which is performed by the present invention.
Figure 3I:
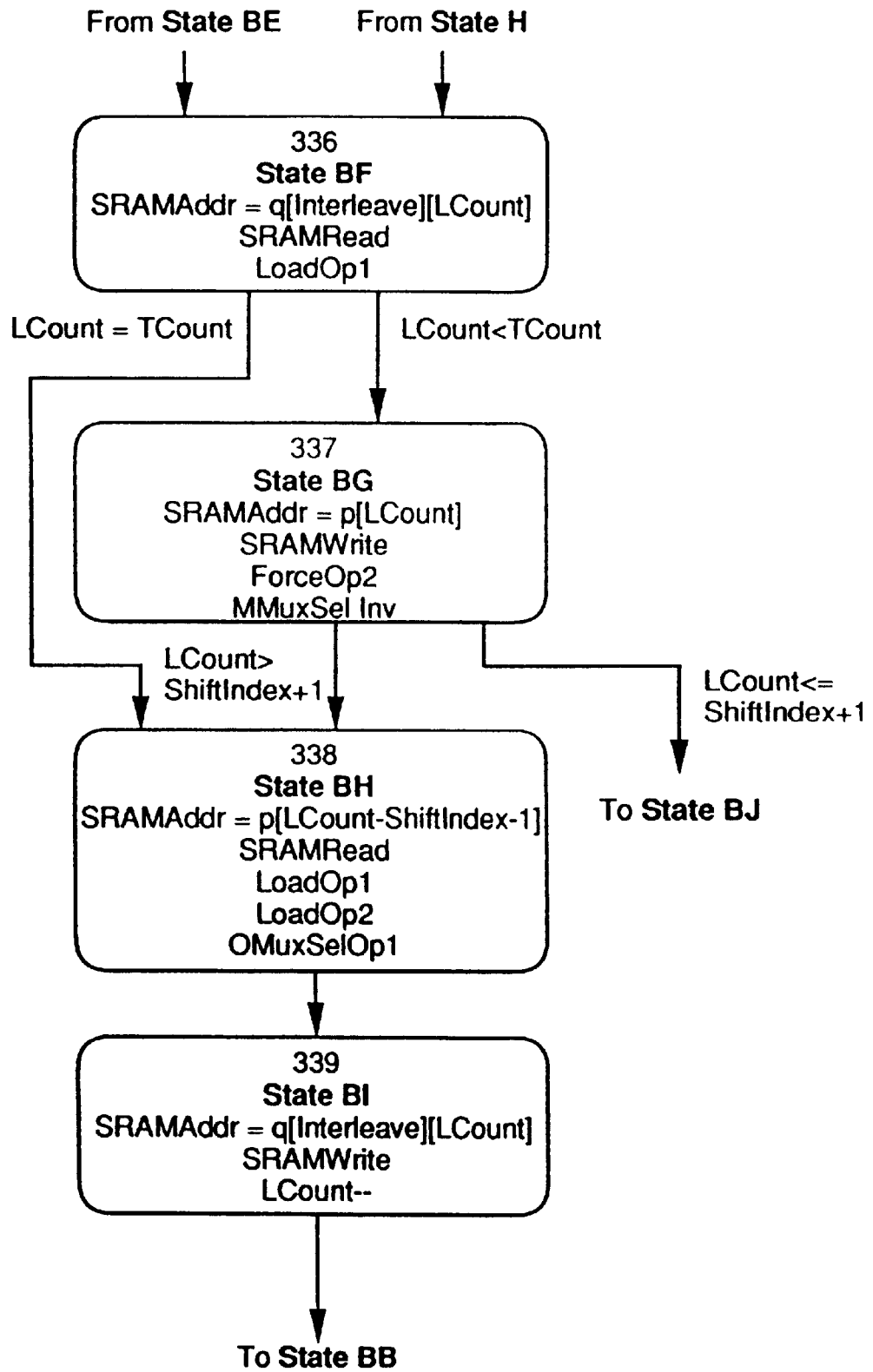
FIG. 3i is a flow diagram of a state BF 336 through a state BI 339 of a process 300 which is performed by the present invention.
Figure 3J:
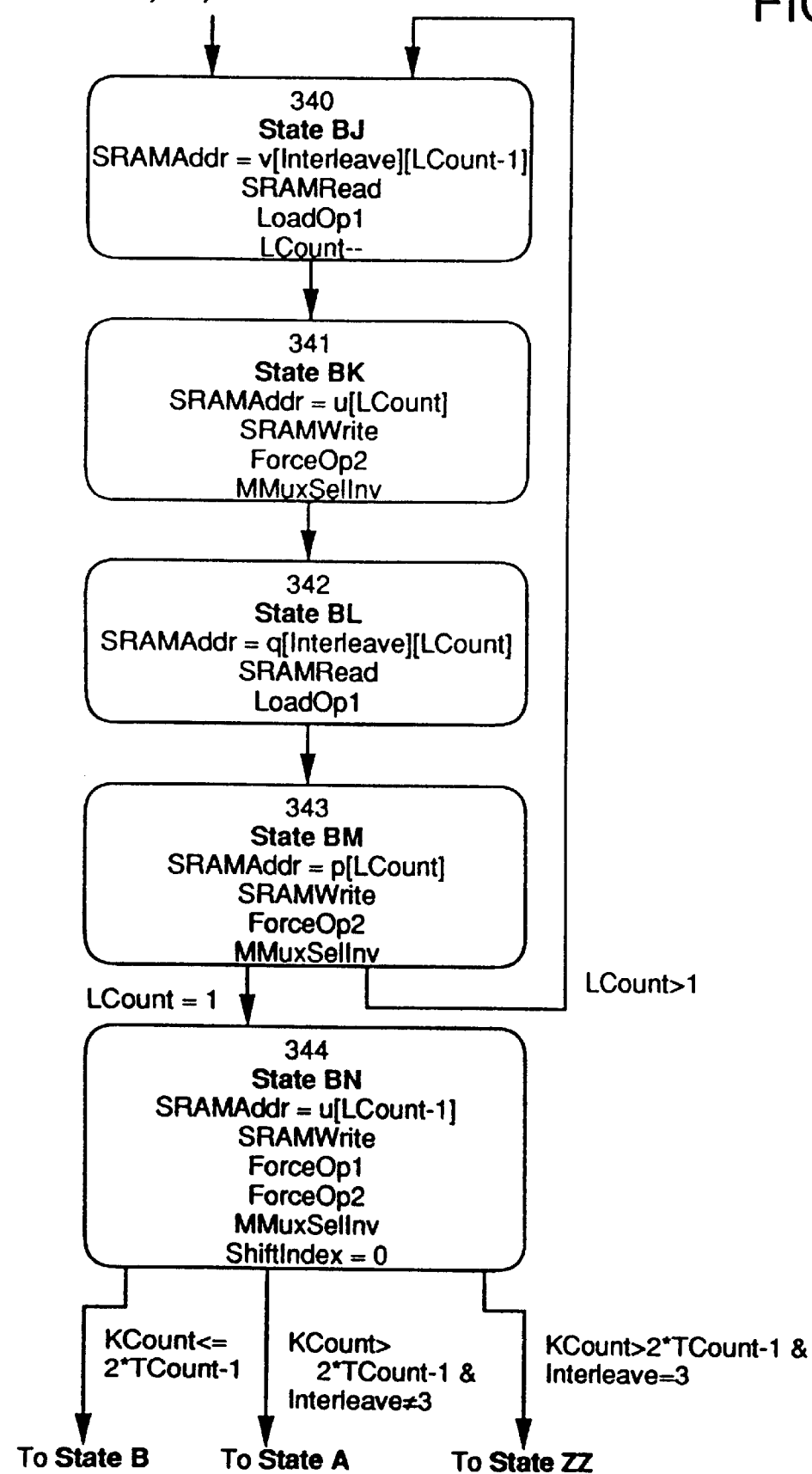
FIG. 3j is a flow diagram of a state BJ 340 through a state BN 344 of a process 300 which is performed by the present invention.
Figure 3K:
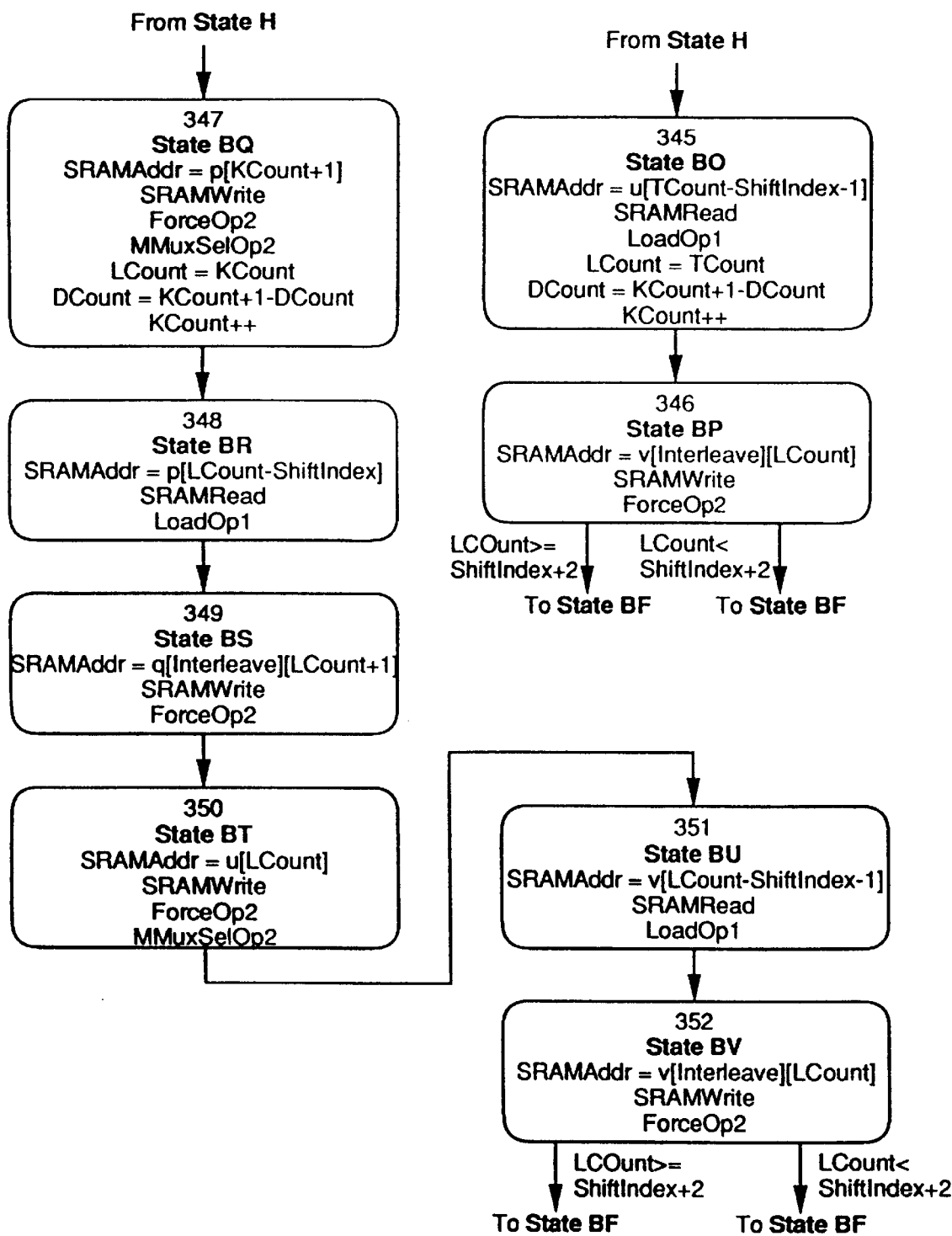
FIG. 3k is a flow diagram of a state BO 345 through a state BV 352 of a process 300 which is performed by the present invention.

FIG. 2b is a block diagram of controller 228 of FIG. 2a. State machine 240 accepts inputs, generates outputs and controls the process. State machine 240 has 52 states, as described in greater detail in FIGS. 3a–k. Five counters are used to control the execution flow. The size of these five counters depends on the correction power of the code being used. In a preferred embodiment, the counters have the stated sizes. KCount 242 is a four-bit counter used to track iterations through the main loop of the process. DCount 244 is a four-bit counter used to resolve branch conditions in the main loop of the process. LCount 246 is a three-bit counter used as a general loop counter. ShiftIndex 248 is a three-bit counter that tracks how many times the u and p vectors have been shifted. Interleave 250 is a two-bit counter that is used to keep track of which interleave is being processed. Input signal TCount 276 indicates the correction power of the code to state machine 240. Input signal StartKES 278 initiates the process.

Twelve control signals are output from state machine 240. RAMAddr 252 is the address into RAM 204. RAMRead 254, when active, causes a read cycle to be performed from RAM 204. RAMWrite 256, when active, causes a write cycle to be performed to RAM 204. LoadOp1 258, when active, causes OP1 208 to be loaded. LoadOp2, when active, causes OP2 210 to be loaded. LoadAcc 262, when active, causes ACC 222 to be loaded. ForceOp1 264, when active, causes forcing circuit 212 to drive 0x01 on its output. Otherwise, forcing circuit 212 passes through its input to its output. ForceOp2 266, when active, causes forcing circuit 214 to drive 0x00 on its output. Otherwise, forcing circuit 214 passes through its input to its output. OMuxSelOp1 268, when active, causes MUX 206 to select the input coupled to OP1 208 to be passed to the output. Otherwise, the input coupled to RAM 204 is passed to the output. AMuxSelOp2 270, when active, causes MUX 218 to select the input coupled to forcing circuit 214 to be passed to the output. Otherwise, the input coupled to adder 216 is passed to the output. MMuxSelOp2 272 and MMuxSelInv 274 together control MUX 220. When MMuxSelOp2 272 is active, it causes MUX 220 to select the input coupled to forcing circuit 214 to be passed to the output. When MMuxSelInv 274 is active, it causes the input coupled to inverse ROM 226 to be passed to the output. When both MMuxSelOp2 272 and MMuxSelInv 274 are inactive, the input coupled to ACC 222 is passed to the output. State machine 240 is designed not to allow both MMuxSelOp2 272 and MMux-SelInv 274 to be active simultaneously.

FIGS. 3a–k are a flow diagram of a process 300 which is performed by the present invention under the control of state machine 240. Each step in process 300 corresponds to a state of state machine 240 and are identified as states. The flow diagram indicates the states of state machine 240, the output signals from state machine 240 and the input signals to state machine 240. State ZZ 301 is the idle or ambient state. Activation of the StartKES signal 278 causes state machine 240 to transition to state A 302. State A 302 initializes the counters and increments the interleave count. The process returns to this state at the end of processing of the first two interleaves. In state B 303, the computation of the error term e is begun. State B 303 is also the first state of the main loop of the process and so is entered 2*TCount times per interleave. The computation of the error term e occurs in one of three paths through the state machine. For the first two iterations of the main loop, e is first syndrome zero, then syndrome one. The path is State B 303 to State E 307. For the third iteration through TCount, e has KCount terms and the path includes State B 303, State D 306, State F 305 and State G 308. For the last TCount–1 iterations, e has TCount+1 terms and the path includes State B 303, State C 304, State F 305 and State G 308. After e is computed, by any of the three paths, State H 309 is entered.

No computation occurs in state H 309 because the process branches on the value of e and e is loaded into ACC 222 concurrently with state H 309 being entered. From state H 309, the process may branch to any one of eleven different states. The first iteration of the main loop is treated as a special case. If e=0, then the execution path is state I 310, state J 311 and state K 312. Otherwise, the path is state L 313, state M 314 and state N 315. The operation of state K 312 requires further explanation. If e=0, which must be true to be in state K 312, the u and p vectors are shifted. The initial condition of the p vector is element zero is one and all other elements are zero. In the first iteration of the main loop, element zero is set to zero and is never changed thereafter. Therefore, it is not necessary to actually allocate space in RAM 204 for element zero. This non-existent element zero is shifted into element one in state K 312. Since ACC 222 contains zero when in state K 312, the address into inverse ROM 226 is zero. Because the inverse of zero is not defined, this location in the ROM is not used in the normal way. Rather, this location is programmed with 0x01. In state K 312, it is this value which is transferred into the RAM location for element one of the p vector.

After iteration zero has completed, control from state H 309 flows down one of three main branches which correspond to the if, else-if, else structure presented in the pseudocode listing of Table A. Each of these three main branches has three entry points, one for KCount<TCount, one for KCount=TCount and one for KCount>TCount. The three entry points to each branch are needed because variables stored in RAM 204 are not initialized prior to starting the key equation solver. In iteration k, element k+1 of the q vector, element $q_{k+1}$, must be assigned a new value based on an assumed current value of zero. The same is true for element k of the v vector, $v_k$. For the second else-if branch, $p_{k+1}$ and $u_k$ are loaded with zeros. Therefore, if KCount<TCount, then $q_{k+1}$, $v_k$, $p_{k+1}$ and $u_k$ must be treated as special cases. If KCount=TCount, then only $v_k$ and $u_k$ must be treated as special cases. For KCount>TCount, all variables have previously been initialized and no special cases need be considered.

The if e=0 branch is the simplest to implement. For the case KCount>TCount, execution passes from state H 309 to state O 316 where ShiftIndex 248 is incremented and control is passed to the next iteration. For KCount=TCount, State Q 318 is entered. In state Q 318, $v_k$ is set to zero before going on to the next iteration of the main loop. For KCount<TCount, $q_{k+1}$ is set to zero in state P 317, then $v_k$ is set to zero in state Q 318.

The else-if 2*DCount3KCount+1 branch is handled in state AA 319 through state AL 330. For the case KCount>TCount, all variables have previously been initialized. Elements ShiftIndexÊthrough TCount of the v vector need to be updated. Elements zero through ShiftIndex–1 are not modified because the corresponding elements of the u vector are known to be zero. Similarly, elements ShiftIndex+1 through TCount of the q vector must be updated. One less element of the q vector than the v vector is updated because $p_0$ is always zero after the first iteration of the main loop. The path that handles the normal updating of the v and q vectors is a loop from state AB 320 through state AG 325, with the entry point through state AA 319 and the exit point through state AC 321. For the case of KCount=TCount, $v_k$ is not yet initialized and must be handled as a special case before dropping into the usual execution flow. The special handling is performed in state AL 330 and state AK 329. For the third case. KCount<TCount, both $v_k$ and $q_{k+1}$ are uninitialized and must be handled as special cases. Entry for this path is through state AH 326.

The final branch, the else branch, of the main loop is handled by state BA 331 through state BV 352. This branch is considerably more complicated because all for vectors require updating over different ranges of elements. For the case KCount>TCount, $u_{T-1}$ through $u_0$, $v_T$ through $v_{ShiftIndex+1}$, $p_{T-1}$ through $p_1$, and $q_T$ through $q_{ShiftIndex+2}$ must be computed. For the case KCount=TCount, the same variables must be updated and in addition $v_T$ must be initialized. For the case KCount<TCount, $u_k$ through $u_0$, $v_k$ through $v_{ShiftIndex+1}$, $p_{k+1}$ through $p_1$, and $q_{k+1}$ through $q_{ShiftIndex+2}$ require updating. In addition, $v_k$ and $q_{k+1}$ must be initialized and $u_k$ and $p_{k+1}$ must be set to zero.

The circuit of FIG. 2a, as controlled by FIGS. 3a–k implements the process described in Table A above. For example, Table C describes the interaction of circuitry and control signals which implement the step $q_i \mathcal{C} q_i - (e_i p_i)$:

TABLE C

| State Machine Action | Result |
|---|---|
| State AD: | Fetch $q_I$: |
| RAMAddr = q[Interleave][LCount] | Address of $q_I$ |
| RAMRead | Read $q_I$ from RAM |
| LoadOp2 | Store $q_I$ in OP2 |
| State AE: | Fetch $p_I$: |
| RAMAddr = p[LCount-ShiftIndex] | Address of $p_I$ |
| RAMRead | Read $p_I$ from RAM |
| LoadOp1 | Store $p_I$ in OP1 |
| State AF: | Multiply, subtract and store in $q_I$: |
| RAMAddr = q[Interleave][LCount] | Address of $q_I$ |
| RAMWrite | Write $q_i \leftarrow q_i - (e_i \cdot p_i)$ |
| Not active: | |
| MMuxSelOp2 and MmuxSelInv | MUX 220 selects ACC as one operand to multiplier (e was previously stored in ACC). Multiplier operands are OP1: $p_I$ and ACC:e. Output from multiplier is $e_i \cdot p_i$ |
| OmuxSelOp1 | MUX 206 selects RAM output to be passed to OP2. Operands to adder 202 are multiplier output: $e_i \cdot p_i$ and OP2: $q_I$. Adder outputs $q_i - (e_i \cdot p_i)$ which is written to RAM |

All the steps of the process described in Table A are implemented similarly, as will be seen by one of skill in the art.

What is claimed is:

1. In a system for correcting errors in a Reed-Solomon encoded datastream, comprising a syndrome generator outputting syndromes of the datastream, a circuit, coupled to the syndrome generator and receiving the syndromes, for performing a computation of a plurality of coefficients of an error locator polynomial and a plurality of coefficients of an error evaluator polynomial, comprising:

(a) an arithmetic unit performing arithmetic and logical operations on portions of the received syndromes, comprising:
  a random access memory, having a bidirectional port selectably operable as an input or an output, storing a plurality of signals representing a plurality of data elements,
  a first operand register, having an input coupled to the port of the memory and an output, storing a data element output from the memory,
  a first forcing device, having an input coupled to the output of the first operand register and an output, selectably outputting either the input data element or a predetermined fixed data element,
  a first multiplexer, having a first input coupled to the output of the first operand register, a second input coupled to the port of the memory and an output, selectably outputting either the data element output from the first operand register or the data element output from the memory,
  a second operand register, having an input coupled to the output of the first multiplexer and an output, storing a second operand,
  a second forcing device, having an input coupled to the second operand register and an output, selectably outputting either the input data element or a predetermined fixed data element,
  a second multiplexer, having a first input coupled to the second forcing device, a second input, a third input and an output, outputting a data element selected from among the data elements present at its inputs,
  a multiplier, having a first input coupled to the output of the first forcing device, a second input coupled to the output of the second multiplexer and an output, generating a data element representing the Galois field product of the data elements present at its inputs,
  an accumulator, having an input and an output coupled to the second input of the second multiplexer, outputting a data element representing the accumulation of a plurality of data elements input to the accumulator,
  an inverse ROM, having an input coupled to the output of the accumulator and an output coupled to the third input of the second multiplexer, outputting a data element representing a Galois field inverse of the data element present on its input,
  output from the accumulator,
  a first adder, having a first input coupled to the output of the accumulator, a second input coupled to the output of the multiplier and an output, generating a data element representing a Galois field sum of the data elements present at its inputs,
  a third multiplexer, having a first input coupled to the output of the second forcing device and a second input coupled to the output of the multiplier, outputting a data element selected from between those present at its inputs, and
  a second adder, having a first input coupled to the output of the multiplier, a second input coupled to the output of the second forcing device and an output coupled to the port of the memory, outputting to the memory a data element representing a Galois field sum of the data elements present at its inputs; and (b) a controller, controlling the sequence of operations performed by the arithmetic unit, comprising:
  a first counter outputting a count of iterations of the computation,
  a second counter outputting signals allowing branch conditions to be resolved,
  a third counter outputting a loop count,
  a fourth counter outputting the count of shifts of data elements stored in the memory,
  a fifth counter outputting an interleave, and
  a finite state machine, having as inputs the outputs of the five counters and having a sixth input accepting a signal indicating the correction power of the code and a seventh input accepting a signal indicating the state machine is to begin processing, and having twelve outputs, comprising:
    a first output for the address of the data element to be accessed in the memory,
    a second output which causes a data element to be output from the memory, a third output which causes a data element to be input to the memory, a fourth output which causes the first operand register to store a data element output from the memory, a fifth output which causes the second operand register to store a data element output from the first multiplexer, a sixth output which causes the accumulator to store a data element output from the second multiplexer, a seventh output which causes the first forcing device to output a predetermined fixed data element, an eighth output which causes the second forcing device to output a predetermined fixed data element, a ninth output which causes the first multiplexer to select the data element stored in the first operand register to be output to the second operand register, a tenth output which causes the second multiplexer to select the output from the second forcing device to be output to the accumulator, an eleventh output which causes the third multiplexer to select the output from the second forcing device to be output to the multiplier, and a twelfth output which causes the third multiplexer to select the output from the inverse ROM to be output to the multiplier.

2. The circuit of claim 1, wherein the random access memory is a static random access memory.

3. The circuit of claim 2, wherein the random access memory is a single-port random access memory.

4. The circuit of claim 3, wherein the random access memory is a multi-port random access memory.

* * * * *